(12) United States Patent
Norberg et al.

(10) Patent No.: US 10,211,595 B2
(45) Date of Patent: Feb. 19, 2019

(54) DENSELY ARRAYED WAVEGUIDES WITH LOW CROSS-COUPLING

(71) Applicant: Aurrion, Inc., Goleta, CA (US)

(72) Inventors: Erik Johan Norberg, Santa Barbara, CA (US); Brian Koch, San Carlos, CA (US); Gregory Alan Fish, Santa Barbara, CA (US); Hyundai Park, Goleta, CA (US); Jared Bauters, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 0 days.

(21) Appl. No.: 15/612,342

(22) Filed: Jun. 2, 2017

(65) Prior Publication Data

US 2017/0271845 A1 Sep. 21, 2017

Related U.S. Application Data

(63) Continuation of application No. 14/870,225, filed on Sep. 30, 2015, now Pat. No. 9,685,761.
(Continued)

(51) Int. Cl.
*H01S 5/06* (2006.01)
*G02B 6/12* (2006.01)
(Continued)

(52) U.S. Cl.
CPC ........ *H01S 5/0612* (2013.01); *G02B 6/12009* (2013.01); *G02B 6/2938* (2013.01);
(Continued)

(58) Field of Classification Search
CPC ...... H01S 5/0612; H01S 5/14; H01S 5/06821; H01S 5/026; H01S 5/0261; G02B 6/2938; G02B 6/29344; G02B 6/12009
See application file for complete search history.

(56) References Cited

U.S. PATENT DOCUMENTS 5,015,066 A * 5/1991 Cressman ................ G02B 6/04
355/1
5,675,592 A * 10/1997 Dragone ................ H01S 5/4062
372/20
(Continued)

FOREIGN PATENT DOCUMENTS

WO WO-0133268 A1 5/2001
WO WO-2008080171 A1 7/2008

OTHER PUBLICATIONS

"U.S. Appl. No. 14/870,225, Final Office Action dated Aug. 26, 2016", 15 pgs.
(Continued)

*Primary Examiner* — Xinning(Tom) Niu
(74) *Attorney, Agent, or Firm* — Schwegman Lundberg & Woessner, P.A.

(57) ABSTRACT

Described herein are lasers comprising an output port to output an optical signal, a plurality of waveguide segments forming an optical cavity length, and a resonant optical cavity comprising the optical cavity length, a gain medium included in the resonant optical cavity to amplify the optical signal, and a heating element disposed near at least two of the plurality of waveguide segments, the heating element controllable to adjust the phase of the optical signal by heating the waveguide segments. Described herein are optical devices comprising a first plurality of ports to output a plurality of optical signals, a second plurality of ports to receive the plurality of optical signals, and a plurality of coupling waveguides. The plurality of waveguide may comprise a pair of adjacent waveguides separated by a first distance, each of the pair of adjacent waveguides comprising a different width.

22 Claims, 7 Drawing Sheets

Related U.S. Application Data

(60) Provisional application No. 62/059,218, filed on Oct. 3, 2014.

(51) Int. Cl.

| | |
|---|---|
| *G02B 6/293* | (2006.01) |
| *H01S 5/068* | (2006.01) |
| *H01S 5/14* | (2006.01) |
| *H01S 5/026* | (2006.01) |

(52) U.S. Cl.
CPC ...... *G02B 6/29344* (2013.01); *H01S 5/06821* (2013.01); *H01S 5/14* (2013.01); *H01S 5/026* (2013.01); *H01S 5/0261* (2013.01)

(56) References Cited

U.S. PATENT DOCUMENTS

| | | | |
|---|---|---|---|
| 5,719,976 A | 2/1998 | Henry et al. | |
| 9,685,761 B2* | 6/2017 | Norberg | H01S 5/0612 |
| 2002/0064336 A1* | 5/2002 | Graves | H04J 14/0293 |
| | | | 385/17 |
| 2004/0047583 A1* | 3/2004 | Chiba | G02F 1/225 |
| | | | 385/140 |
| 2004/0096150 A1* | 5/2004 | Laudo | G02B 6/12007 |
| | | | 385/24 |
| 2004/0105480 A1* | 6/2004 | Sidorin | H01S 5/141 |
| | | | 372/97 |
| 2010/0254416 A1 | 10/2010 | Suzuki | |
| 2013/0016744 A1 | 1/2013 | Li et al. | |
| 2014/0064658 A1* | 3/2014 | Ramaswamy | G02B 6/12004 |
| | | | 385/14 |
| 2014/0133511 A1* | 5/2014 | Tanaka | H01S 5/0687 |
| | | | 372/50.11 |
| 2016/0099546 A1 | 4/2016 | Norberg et al. | |

OTHER PUBLICATIONS

"U.S. Appl. No. 14/870,225, Non Final Office Action dated Feb. 19, 2016", 13 pgs.

"U.S. Appl. No. 14/870,225, Notice of Allowance dated Feb. 22, 2017", 8 pgs.

"U.S. Appl. No. 14/870,225, Response filed May 19, 2016 to Non Final Office Action dated Feb. 19, 2016", 9 pgs.

"U.S. Appl. No. 14/870,225, Response filed Nov. 28, 2016 to Final Office Action dated Aug. 26, 2016", 6 pgs.

"European Application Serial No. 15002838.9, Extended European Search Report dated Jun. 3, 2016", 10 pgs.

"European Application Serial No. 15002838.9, Response filed Jan. 5, 2017 to Extended European Search Report dated Jun. 3, 2016", 17 pgs.

Densmore, Adam, et al., "Compact and Low Power Thermo-optic Switch Using Folded Silicon Waveguides", Optics Express 10459. vol. 17, No. 13, (Jun. 8, 2009), 9 pgs.

\* cited by examiner

DENSELY ARRAYED WAVEGUIDES WITH LOW CROSS-COUPLING

CROSS-REFERENCE TO RELATED APPLICATIONS

This application claims the benefit of priority to U.S. patent application Ser. No. 14/870,225, filed Sep. 30, 2015, which claims priority to U.S. Provisional Patent Application Ser. No. 62/059,218, filed Oct. 3, 2014, which are hereby incorporated herein by reference in their entirety.

FIELD

Embodiments generally pertain to optical devices and more specifically to optical components included in photonic integrated circuits.

BACKGROUND

Various design aspects of optical devices can cause device inefficiencies. For long laser cavities, stabilizing the output signal wavelength uses a lot of power due to the large physical size of the cavity. Attempts at minimizing a footprint of laser (and other optical devices) can be limited by the possibility of optical signal cross-coupling between densely arrayed waveguides.

BRIEF DESCRIPTION OF THE DRAWINGS

The following description includes discussions of figures having illustrations given by way of example of implementations and embodiments of the subject matter disclosed herein. The drawings should be understood by way of example, and not by way of limitation. As used herein, references to one or more "embodiments" are to be understood as describing a particular feature, structure, or characteristic included in at least one implementation of the disclosure. Thus, phrases such as "in one embodiment" or "in an alternate embodiment" appearing herein describe various embodiments and implementations of the disclosure, and do not necessarily all refer to the same embodiment. However, such phrases are also not necessarily mutually exclusive.

Descriptions of certain details and implementations follow, including a description of the figures, which may depict some or all of the embodiments described below, as well as a description of other potential embodiments or implementations of the concepts presented herein. An overview of embodiments is provided below, followed by a more detailed description with reference to the drawings.

DESCRIPTION

Embodiments of the disclosure describe optical devices comprising dense arrayed waveguides with low cross-coupling. Throughout this specification, several terms of art are used. These terms are to take on their ordinary meaning in the art from which they come, unless specifically defined herein or unless the context of their use would clearly suggest otherwise. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects of the disclosure.

Figure 1:
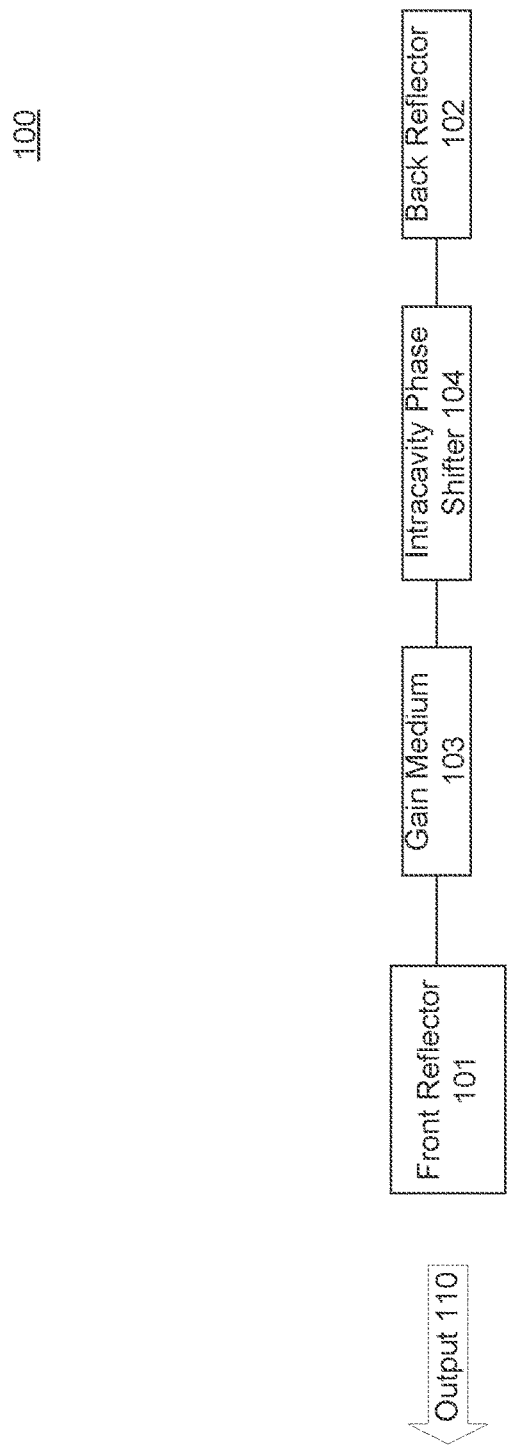
FIG. 1 is an illustration of a laser device in accordance with some embodiments.

FIG. 1 is an illustration of a laser device in accordance with some embodiments. A laser 100 is shown to include a laser cavity formed from a front reflector 101 and a back reflector 102; a gain medium 103 and an intracavity phase shifter 104 are included in said laser cavity. While illustrated in this example as a linear cavity, said laser cavity may comprise any shape in other embodiments; for example, in some embodiments, ring-shaped laser cavities are utilized. An optical signal is transmitted from the laser 100 via an output port 110.

The gain medium 103 may comprise any structure or material suitable for amplifying an optical signal. For example, the gain medium 103 may be formed from a III-V semiconductor material, a germanium (Ge) material, etc. The components of the laser 100 may be formed from any combination of suitable semiconductor materials—e.g., formed from both a silicon and a non-silicon material. Said non-silicon material (alternatively referred to as "heterogeneous material") may comprise one of III-V material, magneto-optic material, or crystal substrate material. The laser 100 may further be included in a system of discrete optical components, or in a photonic integrated circuit (PIC) comprising multiple optical components.

The intracavity phase shifter 104 is included in the cavity of a laser; the phase shifter 104 is capable of a continuous phase shift at a single wavelength over a large range (e.g., where the maximum energy consumption of the phase shifting component does not scale with the phase shifting range). Phase shifters may shift the phase of the optical signal of a laser utilizing a variety of processes and components, such as utilizing resistive heaters, resistive heating of doped silicon, silicon carrier injection or depletion modulators, heterogeneous-integrated III-V phase modulators, native substrate III-V phase modulators, etc.

The phase shifter 104 shifts the phase of the optical signal to maintain its output wavelength and avoid mode-hops in the presence of fluctuations such as temperature drift or laser drive current changes (e.g., detected via any feedback component suitable to detect a phase/frequency/wavelength change of the optical signal of the laser 100). The phase shifting component may be adjusted to avoid mode hops by compensating for phase shifts caused by temperature fluctuations in the rest of the laser cavity. The total phase shift range may be quite large (i.e., many cycles of 1*PI), especially in embodiments comprising long-cavity lasers and or lasers operated over a large temperature range, due to the dn/dT of the material making up the cavity.

The phase shifter 104 may be able to continuously shift the phase without limit (alternatively referred to herein as an "endless phase shifter"). Some embodiments allow for the continuous shifting of phase at a single frequency without a discontinuity—e.g., utilize a single phase shifting component with a range of at least 0-2*PI (e.g., 0-4*PI, etc.).

Figure 2:
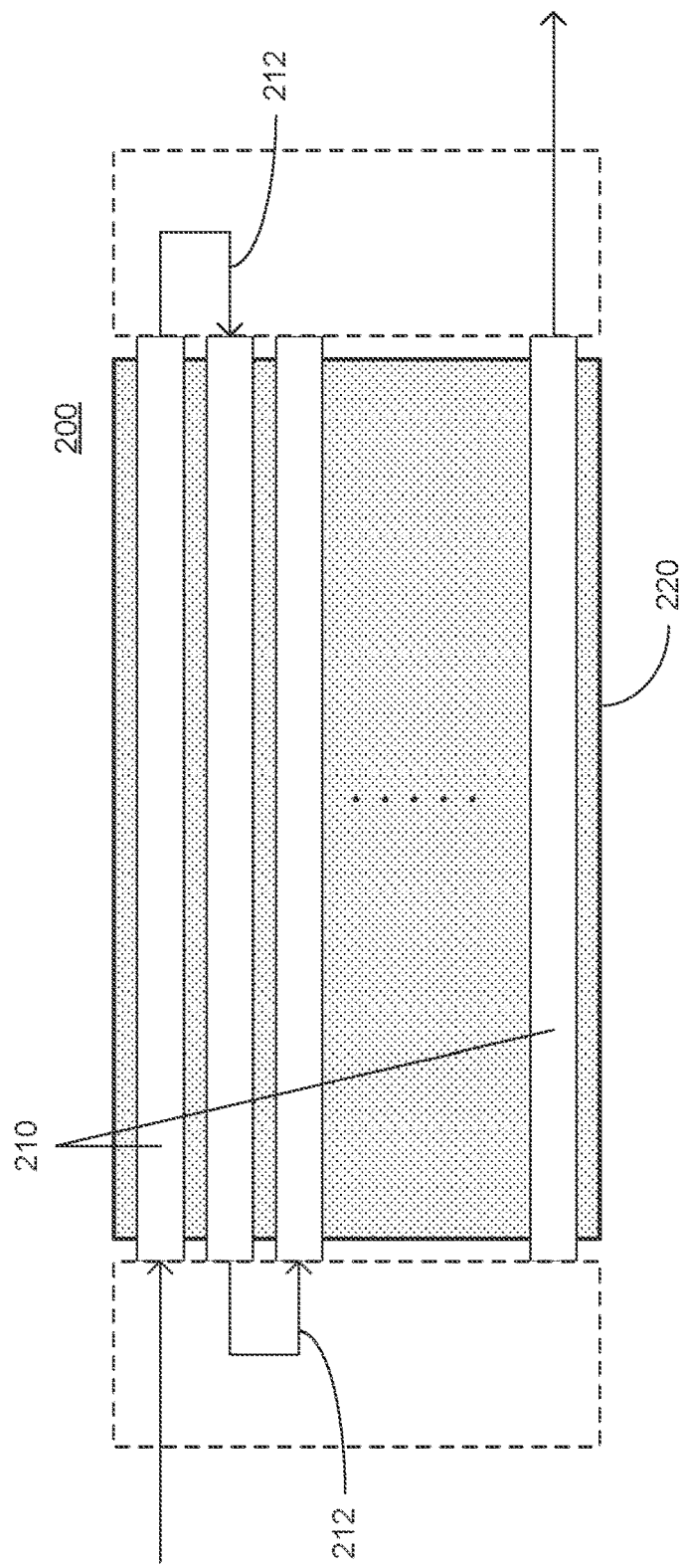
FIG. 2 is an illustration of a laser cavity design in accordance with some embodiments.

FIG. 2 is an illustration of a laser cavity design in accordance with some embodiments. A laser cavity 200 is illustrated. In some embodiments, cavities are designed such that, in addition to filtering and gain elements (not illustrated in this figure), add a significant length of additional passive propagation for the purpose of increasing the Q factor (i.e., quality factor) of optical cavities. Such laser cavity designs may be advantageous for low noise operation (e.g., low amplitude and or phase/frequency noise). To further improve a laser's performance and avoid mode hops in a laser cavity, the output wavelength of the laser may be stabilized over a wide temperature range. Typically, stabilizing the wavelength of a cavities with significant length of additional passive propagation involves large amounts of power due to the large physical size of the cavity.

In this embodiment, the laser cavity 200 is shown to comprise a folded waveguide comprising a plurality of waveguide segments 210. The folded waveguide allows for a long cavity length while minimizing the effect of the device's size overall (e.g., the optical cavity length may comprise a length much longer than the length of the device). In this embodiment, each of the plurality of waveguide segments 210 are parallel to each other; in other embodiments, they may be skew. The plurality of waveguide segments 210 are shown to be interconnected via a plurality of waveguide connection segments 212.

The plurality of waveguide segments 210 are shown to be heated by a heating element 220 (while illustrated as a single heating element, in other embodiments, the plurality of waveguide segments 210 may be heated by a plurality of heating elements). The heating element 220 is controllable to adjust a phase of the laser cavity 200 by heating the plurality of waveguide segments 210. In this embodiment, the heating element 220 is disposed to not heat any of the connection waveguide connection segments 212. Thus, the plurality of waveguide segments 210 heated by the heating element 220 comprise the phase tuning section of the laser cavity 200 for compensating for the temperature fluctuations that the entirely of the laser cavity 200 may experience. The folded waveguide design allows for the output wavelength of the laser to be stabilized over a wide temperature range with small tuning power. The heating element 220 may be described as a 'multi-pass'-waveguide heater structure, as the folded waveguide structure allows for the heating element 220 to heat plurality of waveguide segments 210 using one or more resistive heater elements in close proximity.

In some embodiments, the thermal impendence of the laser cavity may be tailored to increase the efficiency of the heater 220—e.g., via means of a backside via and fill process on an SOI wafer including the heater 220 by creating a region of low heat dissipation or heat confinement. For example, substrate near the plurality of waveguide segments 210 may be removed and filled with a low thermal conductivity material such as a polymer, a dielectric, ceramic, or any other low thermal conductivity material Other aspects of the design of the laser cavity 200 may affect the optimization of the phase tuning section. In some embodiments, by designing the plurality of waveguide segments 210 to have a small cross-section (e.g., a narrow and thin waveguide), the volume of material to be heated may be minimized, thereby increasing the power efficiency of the heater. In some embodiments, by minimizing the distance between at least some of the adjacent waveguide segments 210, the total volume of material to be heated may also be minimized. The waveguide delay added in order to route the waveguide back to the heater section (e.g., the delay from waveguide connection segments 212) may also be minimized, as this delay adds to the total cavity length of the laser which the phase tuner need to stabilize. In some embodiments, this is achieved using a high confinement waveguide which supports small bending radii without introducing radiation loss. In some embodiments, the waveguide connection segments 212 comprise total-internal reflection mirrors to make compact 180-degree bends.

Figure 3:
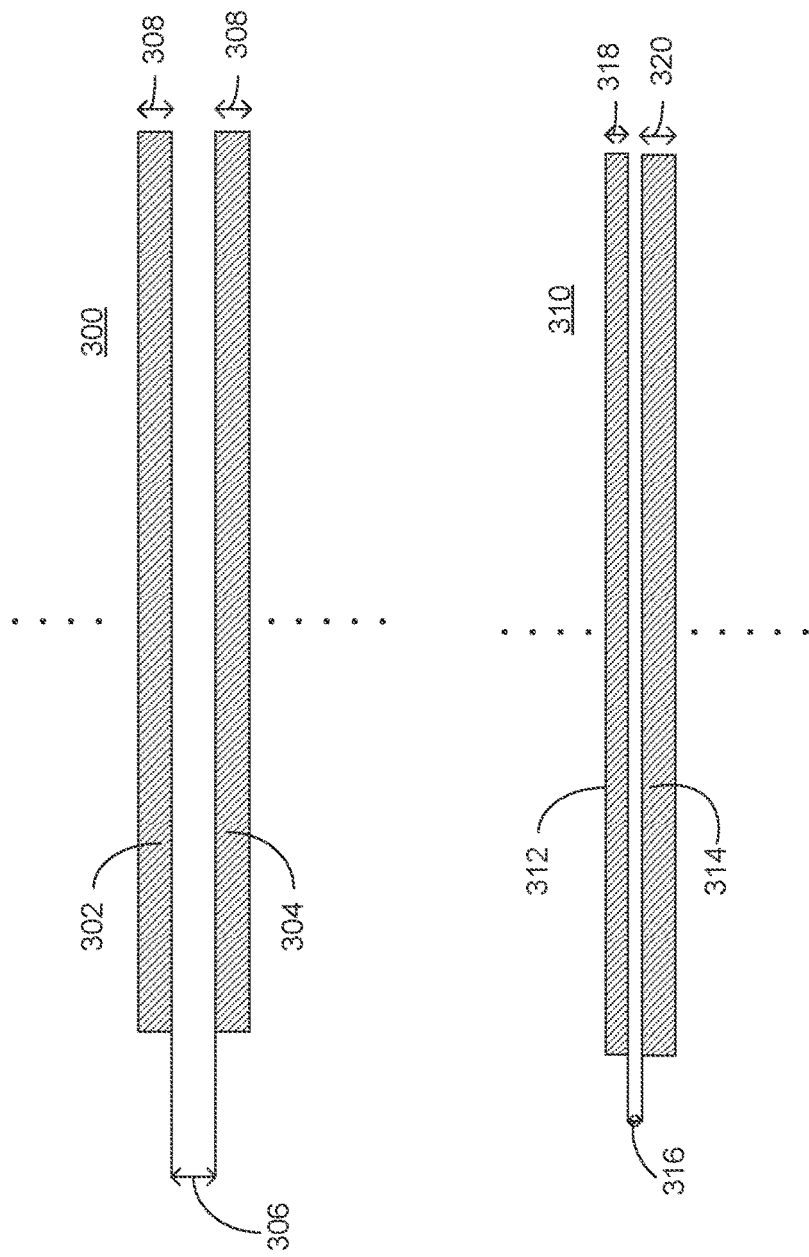
FIG. 3 illustrates adjacent waveguide segment configurations for optical devices in accordance with some embodiments.

FIG. 3 illustrates adjacent waveguide segment configurations for optical devices in accordance with some embodiments. As discussed above, in some embodiments of laser cavity designs, by minimizing the distance between (at least some) adjacent waveguide segments, the total volume of material to be heated may also be minimized. A waveguide segment configuration 300 is shown to include (at least) adjacent waveguide segments 302 and 304 separated by a distance 306. In this example, the waveguide segments 302 and 304 comprise a same width 308. The distance 306 is selected such that optical coupling is minimized between the waveguide segments 302 and 304.

Another waveguide segment configuration 310 is shown to include (at least) adjacent waveguide segments 312 and 314 separated by a distance 316. In this example, the waveguide segments 312 and 314 each comprise different widths—width values 318 and 320, respectively. These different width values allow for suppression of optical coupling between the waveguide segments 312 and 314, as they will comprise different optical indices so that they are non-phase matched. This allows for the distance 316 to be smaller than the distance 306 of the waveguide segment configuration 300. In addition to reducing the footprint of the waveguide segment configuration 310, the reduced separate distance 316 allows for the waveguide segments 312 and 314 to be efficiently phase-tuned using a correspondingly smaller heating element.

Figure 4:
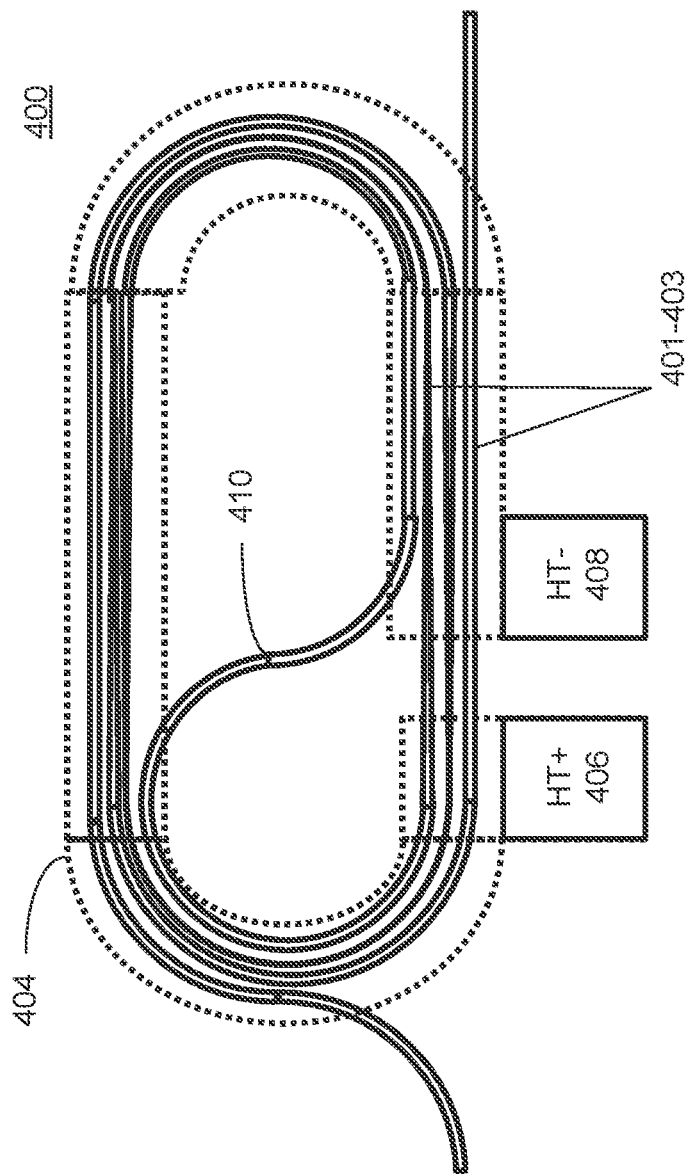
FIG. 4 is an illustration of a waveguide configuration and a heating element in accordance with some embodiments.

FIG. 4 is an illustration of a waveguide configuration and a heating element in accordance with some embodiments. A waveguide 400 is illustrated as a spiral waveguide including waveguide sections 401-403. Adjacent waveguide sections of the waveguide sections 401-403 are shown to have different waveguide widths which, as discussed above, allows for suppression of optical coupling between the adjacent waveguide segments.

A heating element 404 is shown to be formed in a shape similar to that of the waveguide 400. Heating control circuitry 406 and 408 are shown, which may receive electronic control signals to control the heating element 404.

In this embodiment, the spiral shape of the waveguide 400 improves the ratio of the total length of the densely arrayed adjacent waveguide sections (including sections 401-403) to the overall length of the waveguide 400. As the operating temperature of the adjacent waveguide sections is controlled by the heating element 404, reducing unheated waveguide sections maximizes heating efficiency (i.e., the efficiency of heating the laser cavity is improved by avoiding additional cavity length which cannot be heated efficiently). As illustrated in this embodiment, a single turn of a waveguide placed in the center of the spiral (i.e., hairpin waveguide section 410) is used, thereby allowing for an unlimited number of densely spaced parallel folded waveguide paths for the remainder of the waveguide 400.

Figure 5:
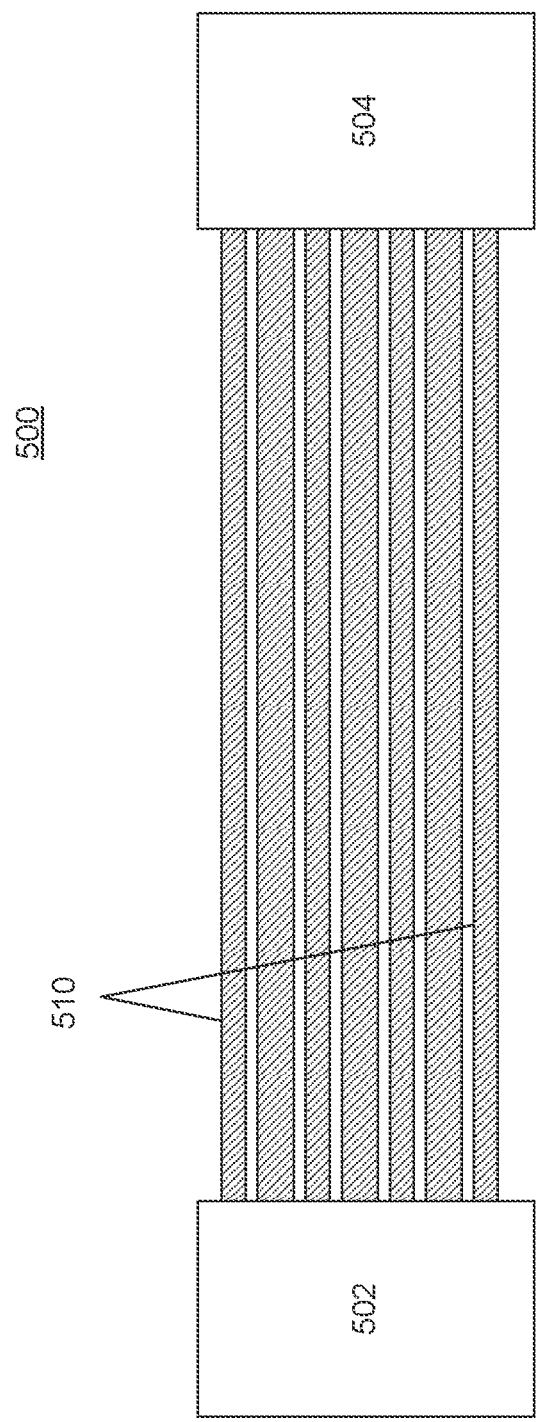
FIG. 5 is an illustration of a waveguide segment configuration including a plurality of waveguide segments comprising alternating width values in accordance with some embodiments.

FIG. 5 is an illustration of a waveguide segment configuration 500 including a plurality of waveguide segments 510 comprising alternating width values coupling a set of ports 502 and 504. The densely spaced waveguides of the waveguide segment configuration 500 may be used to facilitate routing for a multiport photonic device, such as a multimode interference device (MMI), an array waveguide grating (AWG), etc.

Increasing the density of the waveguides and ports to route to and from these types of components may optimize the footprint, thermal efficiency, and/or performance specifications of these devices. Additionally, a densely spaced waveguide bus used, for example, to carry separate signals in a wavelength division multiplexing (WDM) system, may be used to minimize the footprint of a waveguide bus on a PIC. In the use cases of a heated waveguide array, a device port connector, and/or a waveguide bus in a WDM system, cross-coupling between closely spaced waveguides may degrade the performance of the device or system in a PIC. As discussed above, the different width values for adjacent waveguide segments of the waveguide segment configuration 500 allow for suppression of optical coupling between adjacent segments, as they will comprise different optical indices so that they are non-phase matched. This allows for a denser layout for the waveguide segment configuration 500 compared to a configuration of waveguide segments comprising equal widths.

Figure 6:
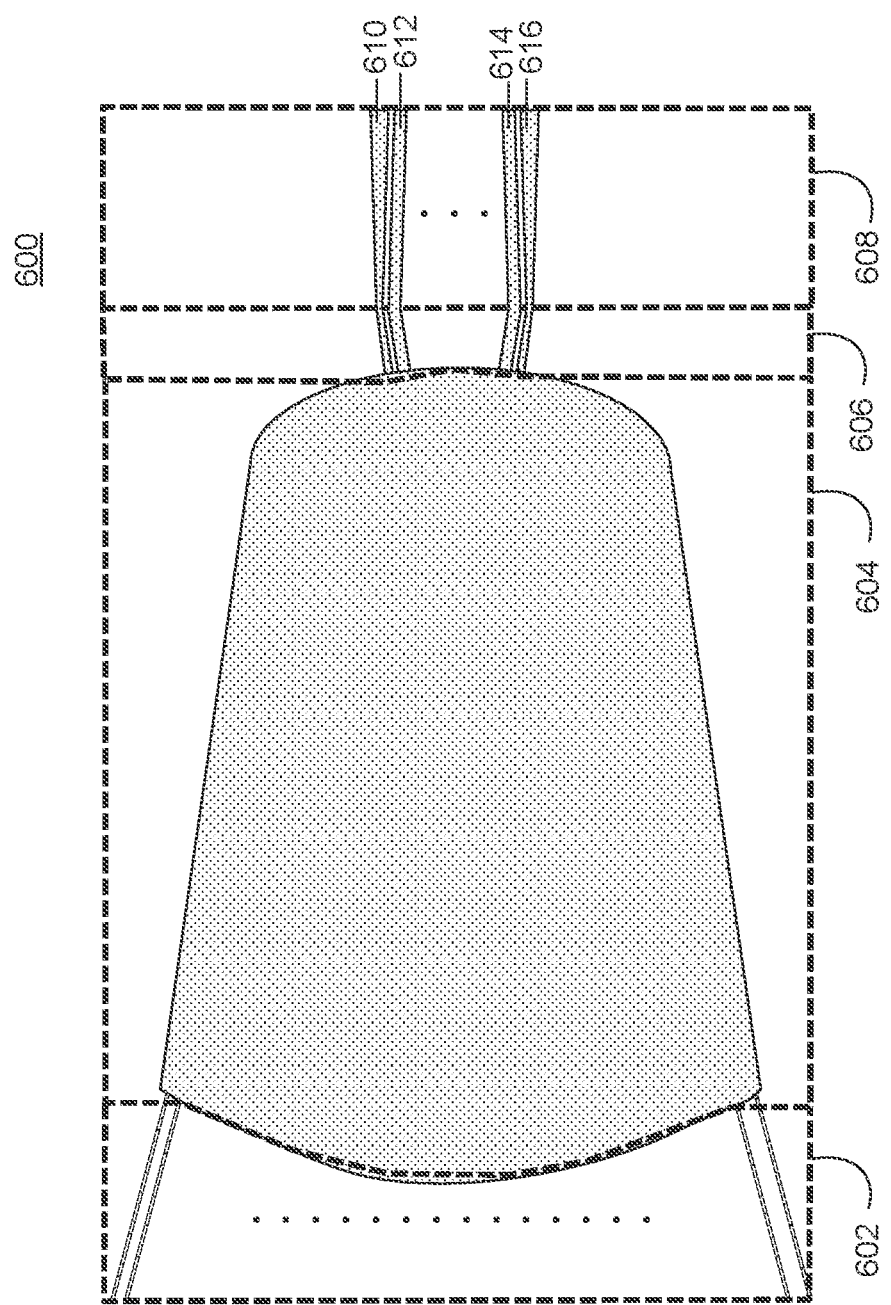
FIG. 6 is an illustration of an array waveguide grating in accordance with some embodiments.

FIG. 6 is an illustration of an AWG in accordance with some embodiments. An AWG 600 is shown to include a phase array section 602 (only partially illustrated), a free propagation region 604, a plurality of waveguide ports (coupled to ports of the FPR) 606, and a plurality of waveguide connections 608 for coupling the AWG 600 to another component or device.

The plurality of waveguide connections 608 are shown to comprise different waveguide widths for adjacent waveguides (e.g., waveguides 610 and 612 are shown to comprise different widths, and waveguides 614 and 616 are also shown to comprise different widths). These different widths allow for a densely spaced configuration for the plurality of waveguide connections 608 with minimized waveguide-to-waveguide coupling, which allows for a reduced footprint of WDM systems without compromising channel-to-channel crosstalk. The different waveguide widths also allows for low-crosstalk connections for other WDM devices, such as MMIs.

Figure 7:
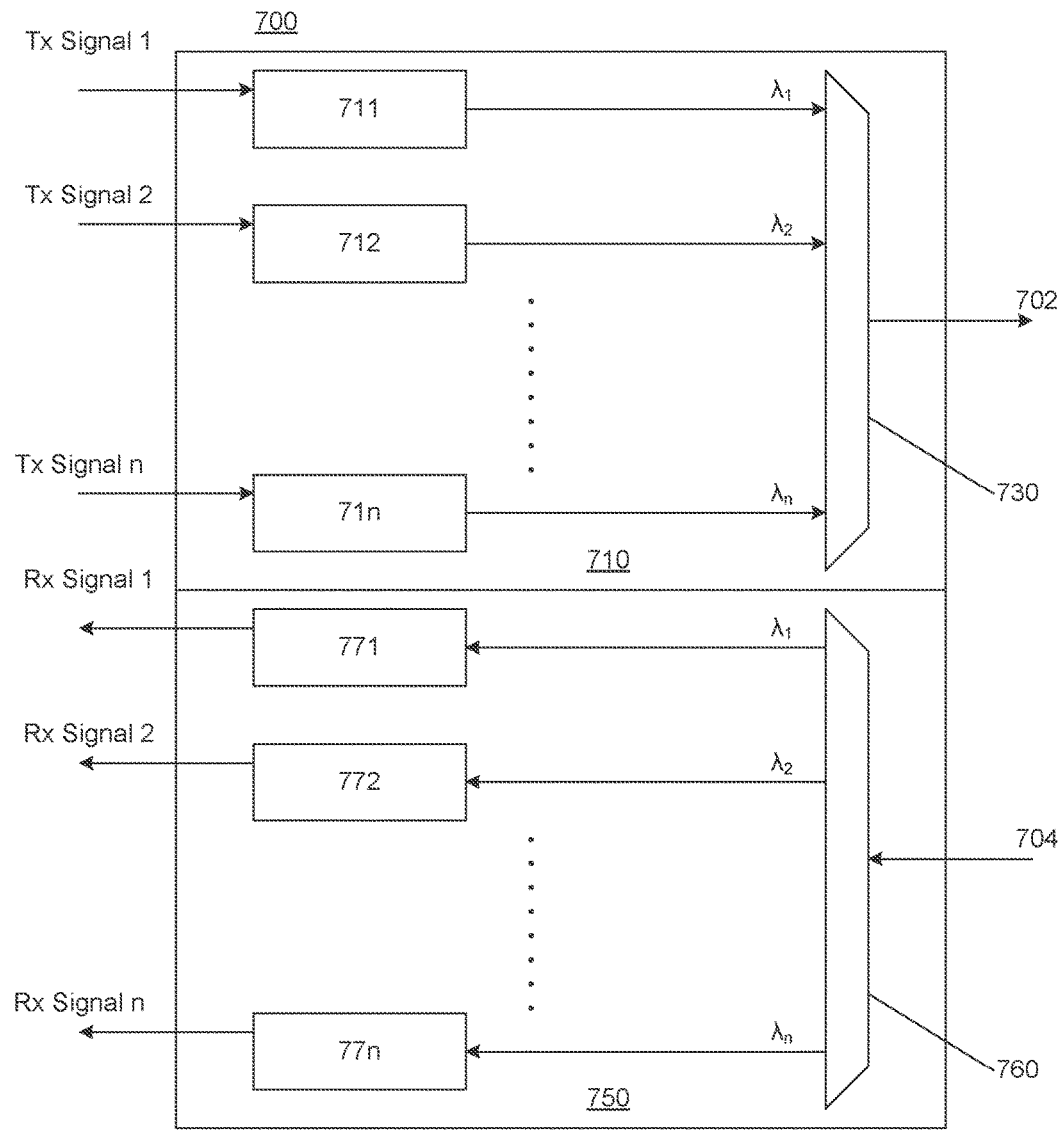
FIG. 7 illustrates a tunable multi-wavelength optical transceiver in accordance with some embodiments.

FIG. 7 illustrates a tunable multi-wavelength optical transceiver in accordance with some embodiments. In this embodiment, a transceiver 700 includes a transmitter module 710 for generating an output WDM signal 702 having n different WDM wavelengths. These different WDM wavelengths can be based, for example, on, the L, C and S bands for WDM applications. The transmitter module 700 includes tunable laser modules 711-71n to generate light, which can be further modulated based on transmission signal data. Said laser modules and modulators can be integrated or discrete components (not shown). A multiplexer 730 is shown to receive n modulated signals and outputs a WDM output signal 702 that comprises multiple output channels within a WDM spectral band.

The transceiver 700 further includes a receiver module 750 including a de-multiplexer 760 to receive a WDM input signal 704 and output the received signal at different WDM wavelengths along n different optical paths. It is to be understood that in other embodiments, the transmitter module 710 and the receiver module 750 can be included in separate devices (i.e., a separate transmitter and receiver). In this embodiment, optical detectors 771-77n are included in the n optical paths and convert the de-multiplexed signals of the WDM input signal 704 into n reception data signals for further processing.

In this embodiment, various components of the transmitter module 710 and the receiver module 750 may include any of the densely arrayed waveguide configurations with low cross-talk discussed above—i.e., waveguide arrays including different widths for adjacent waveguides, allowing for low-crosstalk connections for WDM components, such as AWGs, MMIs, waveguide buses, etc.

Reference throughout the foregoing specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout the specification are not necessarily all referring to the same embodiment. Furthermore, the particular features, structures, or characteristics can be combined in any suitable manner in one or more embodiments. In addition, it is to be appreciated that the figures provided are for explanation purposes to persons ordinarily skilled in the art and that the drawings are not necessarily drawn to scale. It is to be understood that the various regions, layers, and structures represented in the figures can vary in size and dimensions.

The above described embodiments can comprise silicon on insulator (SOI) or silicon-based (e.g., silicon nitride (SiN)) devices, or can comprise devices formed from both silicon and a non-silicon material. Said non-silicon material (alternatively referred to as "heterogeneous material") can comprise one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V-based materials can be significantly higher than in silicon-based materials, as electron speed in III-V semiconductors is much faster than that in silicon semiconductors. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in heterogeneous optical devices; in some embodiments, said heterogeneous devices utilize low-loss heterogeneous optical waveguide transitions between the devices' heterogeneous and silicon-only waveguides.

Magneto-optic materials allow heterogeneous PICs to operate based on the magneto-optic (MO) effect. Such devices can utilize the Faraday effect, in which the magnetic field associated with an electrical signal modulates an optical beam, offering high bandwidth modulation, and rotates the electric field of the optical mode, enabling optical isolators. Said magneto-optic materials can comprise, for example, materials such as iron, cobalt, or yttrium iron garnet (YIG).

Crystal substrate materials provide heterogeneous PICs with a high electro-mechanical coupling, linear electro optic coefficient, low transmission loss, and stable physical and chemical properties. Said crystal substrate materials can comprise, for example, lithium niobate (LiNbO$_3$) or lithium tantalate (LiTaO$_3$).

In the foregoing detailed description, the method and apparatus of the present subject matter have been described with reference to specific exemplary embodiments thereof. It will, however, be evident that various modifications and changes can be made thereto without departing from the broader spirit and scope of the present inventive subject matter. The present specification and figures are accordingly to be regarded as illustrative rather than restrictive.

Some embodiments describe a laser comprising an output port to output an optical signal, a plurality of waveguide segments forming an optical cavity length, and a resonant optical cavity comprising the optical cavity length, a gain medium included in the resonant optical cavity to amplify the optical signal, and a heating element disposed near at least two of the plurality of waveguide segments, the heating element controllable to adjust the phase of the optical signal by heating the at least two waveguide segments.

In some embodiments, at least some of the adjacent waveguide segments of the plurality of waveguide segments comprise different widths. In some embodiments, the plurality of waveguide segments comprises a first pair of adjacent waveguide segments comprising different widths and separated by a first distance, and a second pair of adjacent waveguide segments comprising a same width and separated by a second distance greater than the first distance.

In some embodiments, the plurality of waveguide segments are parallel to each other. In some embodiments, the plurality of waveguide segments form a folded waveguide, the folded waveguide to further include a plurality of waveguide connection segments to optically couple the plurality of waveguide segments parallel to each other, and wherein the heating element is disposed to not heat any of the plurality of waveguide connection segments. In some embodiments, the plurality of waveguide segments are included in a spiral waveguide. In some embodiments, the spiral waveguide consists of a single hairpin connection waveguide segment, and wherein the heating element is disposed to not heat hairpin segment.

In some embodiments, the heating element is controllable to adjust the phase of the optical signal by an interval greater than 2*pi. In some embodiments, the laser is included in a photonic integrated circuit (PIC), and the optical cavity length comprises a length longer than a length of the PIC.

Some embodiments describe an optical device comprising a first plurality of ports to output a plurality of optical signals, a second plurality of ports to receive the plurality of optical signals, and a plurality of waveguides coupling the first plurality of ports and the second plurality of ports. The plurality of waveguide may comprise a first pair of adjacent waveguides separated by a first distance, each of the first pair of adjacent waveguides comprising a different width, and a second pair of adjacent waveguides separated by a second distance greater than the first distance, each of the second pair of adjacent waveguides comprising a same width.

In some embodiments, the optical device comprises a multi-mode interference (MMI) device. In some embodiments, the optical device comprises an array waveguide grating (AWG). In some embodiments, the device comprises a waveguide bus included in a wavelength division multiplexing (WDM) system.

The invention claimed is:

1. An optical device comprising:
a folded waveguide comprising a plurality of interconnected waveguide segments arranged parallel to each other; and
a multi-pass waveguide heater structure disposed near and configured to controllably heat at least two adjacent ones of the plurality of waveguide segments of the folded waveguide to thereby controllably adjust a phase of an optical signal in the folded waveguide, one of the two adjacent waveguide segments having a width different from a width of the other one of the two adjacent waveguide segments to suppress cross-coupling between the two adjacent waveguide segments.

2. The optical device of claim 1, wherein the plurality of waveguide segments are interconnected by a plurality of waveguide connection segments, and wherein the multi-pass waveguide heater structure is disposed to not heat any of the plurality of waveguide connection segments.

3. The optical device of claim 1, wherein the folded waveguide comprises a spiral waveguide.

4. The optical device of claim 3, wherein the spiral waveguide includes a single hairpin connection waveguide segment, and wherein the multi-pass waveguide heater structure is disposed to not heat the hairpin segment.

5. The optical device of claim 1, wherein the multi-pass waveguide heater structure is controllable to adjust the phase of the optical signal by an interval greater than 2*pi.

6. The optical device of claim 1, wherein the optical device is included in a photonic integrated circuit (PIC).

7. The optical device of claim 6, wherein the folded waveguide forms part of a resonant optical cavity whose length exceeds a length of the PIC.

8. The optical device of claim 1, wherein the folded waveguide comprises curved waveguide segments arranged parallel to each other.

9. The optical device of claim 1, wherein the optical device is implemented in a silicon-on-insulator wafer comprising, near the heated waveguide segments, a backside via.

10. The optical device of claim 9, wherein the backside via is filled with a low-thermal-conductivity material.

11. A method comprising:
adjusting a phase of an optical signal in a folded waveguide comprising a plurality of interconnected waveguide segments arranged parallel to each other by heating at least two adjacent ones of the plurality of waveguide segments that differ in width from each other with a multi-pass waveguide heater structure disposed near the at least two adjacent waveguide segments.

12. The method of claim 11, the method further comprising:
amplifying the optical signal with a gain medium included in the folded waveguide.

13. The method of claim 11, wherein the folded waveguide is included in a laser cavity, the method further comprising:
transmitting the optical signal from the laser via an output port.

14. The method of claim 11, wherein the phase of the optical signal is adjusted by an interval greater than 2*pi.

15. An optical device comprising:
a curved folded waveguide comprising a plurality of interconnected waveguide segments arranged parallel to each other; and
a multi-pass waveguide heater structure arranged near and parallel to, and following a curvature of, at least two adjacent ones of the plurality of waveguide segments, the multi-pass waveguide heater structure controllable to adjust the phase of an optical signal in the folded waveguide by heating the at least two adjacent waveguide segments.

16. The optical device of claim 15, wherein the folded waveguide forms part of a resonant optical cavity.

17. The optical device of claim 16, wherein the optical device is a laser.

18. The optical device of claim 15, wherein the optical device is included in a photonic integrated circuit (PIC).

19. The optical device of claim 15, wherein the folded waveguide comprises a spiral waveguide.

20. The optical device of claim 15, wherein the optical device is implemented in a silicon-on-insulator wafer comprising, near the heated waveguide segments, a backside via filled with a low-thermal-conductivity material.

21. The optical device of claim 1, wherein the two adjacent waveguide segments are curved and the multi-pass waveguide heater structure follows a curvature of the two adjacent waveguide segments.

22. The optical device of claim 1, wherein the folded waveguide comprises at least three interconnected waveguide segments arranged parallel to each other, and wherein the multi-pass waveguide heater structure is configured to controllably heat the at least three waveguide segments, the waveguide segments within any pair of adjacent waveguide segments of the at least three waveguide segments differing in width from each other.

* * * * *